US00RE50357E

(19) United States
(12) Reissued Patent
Chen

(10) Patent Number: US RE50,357 E
(45) Date of Reissued Patent: Mar. 25, 2025

(54) THREE-DIMENSIONAL SEMICONDUCTOR DEVICE

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

(21) Appl. No.: 17/892,183

(22) Filed: Aug. 22, 2022

Related U.S. Patent Documents

Reissue of:
(64) Patent No.: 9,219,074
Issued: Dec. 22, 2015
Appl. No.: 14/157,550
Filed: Jan. 17, 2014

(51) Int. Cl.

| | |
|---|---|
| ***H01L 27/115*** | (2017.01) |
| ***H10B 43/10*** | (2023.01) |
| ***H10B 43/27*** | (2023.01) |
| *H10B 41/10* | (2023.01) |
| *H10B 41/27* | (2023.01) |

(52) U.S. Cl.
CPC ..... *H10B 43/27* (2023.02); *H10B 43/10* (2023.02); *H01L 2924/0002* (2013.01); *H10B 41/10* (2023.02); *H10B 41/27* (2023.02)

(58) Field of Classification Search
CPC ..... H10B 43/27; H10B 43/10; H10B 41/10; H10B 41/27; H10B 41/20; H01L 2924/0002
See application file for complete search history.

(56) References Cited

U.S. PATENT DOCUMENTS

| | | | | |
|---|---|---|---|---|
| 8,431,969 | B2 | 4/2013 | Kim et al. | |
| 8,811,082 | B2 | 8/2014 | Kwon et al. | |
| 2010/0052042 | A1* | 3/2010 | Tanaka | H01L 27/0688 257/E21.409 |
| 2010/0123180 | A1* | 5/2010 | Takano | H01L 29/1037 257/E21.679 |
| 2010/0202206 | A1* | 8/2010 | Seol | H10B 41/10 365/185.17 |

(Continued)

FOREIGN PATENT DOCUMENTS

TW 102139597 10/2013

OTHER PUBLICATIONS

U.S. Appl. No. 14/489,531, filed Sep. 18, 2014.*

*Primary Examiner* — Leonardo Andujar
(74) *Attorney, Agent, or Firm* — McClure, Qualey & Rodack, LLP

(57) ABSTRACT

A 3D semiconductor device is provided, comprising plural memory layers vertically stacked on a substrate and parallel to each other; plural selection lines disposed on the memory layers and parallel to each other; plural bit lines disposed on the selection lines, and the bit lines arranged in parallel to each other and in perpendicular to the selection lines; plural strings formed vertically to the memory layers and the selection lines, and the strings electrically connected to the corresponding selection lines; a plurality of cells respectively defined by the strings, the selection lines and the bit lines correspondingly, and the cells arranged in a plurality of rows and columns, wherein a column direction is parallel to the bit lines while a row direction is parallel to the selection lines. The adjacent cells in the same column are electrically connected to the different bit lines.

33 Claims, 14 Drawing Sheets

(56) References Cited

U.S. PATENT DOCUMENTS

| | | | |
|---|---|---|---|
| 2014/0191388 | A1 | 7/2014 | Chen |
| 2014/0284675 | A1 | 9/2014 | Watanabe |
| 2015/0001613 | A1 | 1/2015 | Yip et al. |
| 2015/0155388 | A1 | 6/2015 | Chen |
| 2015/0179660 | A1 | 6/2015 | Yada et al. |

* cited by examiner

THREE-DIMENSIONAL SEMICONDUCTOR DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*This application is a Reissue Application of Ser. No. 14/157,550, filed Jan. 17, 2014, now U.S. Pat. No. 9,219,074, issued Dec. 22, 2015.*

BACKGROUND

1. Field of the Invention

The disclosure relates in general to a three-dimensional (3D) semiconductor device, more particularly to a high speed vertical channel (VC) 3D semiconductor device.

2. Description of the Related Art

A nonvolatile semiconductor memory device is typically designed to securely hold data even when power is lost or removed from the memory device. Various types of nonvolatile memory devices have been proposed in the related art. Also, manufactures have been looking for new developments or techniques combination for stacking multiple planes of memory cells, so as to achieve greater storage capacity. For example, several types of multi-layer stackable thin-film transistor (TFT) NAND-type flash memory structures have been proposed. Various semiconductor devices with three-dimensional (3D) stacked structures, having single-gate unit cells, double gate unit cells or surrounding gate unit cells, have been provided.

It is desirable to develop a semiconductor device with 3D stacked structure not only with larger number of multiple planes being stacked to achieve greater storage capacity, but also with memory cells having excellent electrical properties (such as reliability of data storage and speed of operation), so that the memory cells can be erased and programmed effectively. Typically, NAND Flash page size is proportional to the number of the bit lines (BL). Accordingly, when the device is scaled down, not only the decreased cost but also the increased read/write data rate are achieved due to the increasing of parallel operation, which leads to higher data rate. Typically, a 3D vertical channel (VC) semiconductor device have larger hole size to reduce the process challenge. However, larger cell size results in less bit line number, less parallel operation, and less speed of read/write data. For a conventional cell design, the cells arranged in the same row are selected by one selection line, and the cells arranged in the same column are corresponding to one bit line. Take 16 cell strings (arranged as 4 rows and 4 columns) with 4 BLs as example; each cell string corresponds to one BL and one select line (such as SSL 1/2/3/4). To obtain all the data in this example, it is required to select the SSL1 to get 4 strings data, then followed by selecting the SSL2, SSL 3 and SSL 4 to get the next 12 strings data. It needs 4 cycles of operation to get all of the strings data under SSL 1/2/3/4. Also, when the SSL1 is operated, the cell strings in the SSL 2/3/4 are also suffered from the same gate bias, thereby suffering from gate disturbance. Besides, the"non-selected strings" having the gate voltage means the unnecessary power consumption. Thus, the conventional cell design has not only low speed of operation, but also large power consumption and large disturbance.

SUMMARY

The disclosure relates to a three-dimensional (3D) semiconductor device. According to the embodied structure of the 3D semiconductor device, all of the cells can be read at the same time, which increases the operation speed. Also, the bandwidth of the 3D semiconductor device is enlarged (increased), the power consumption is reduced, and the disturbance between adjacent cells during reading is also reduced.

According to the present disclosure, a 3D semiconductor device is provided, comprising: a plurality of [memory] *gate* layers vertically stacked on a substrate and parallel to each other; a plurality of selection lines disposed on the [memory] *gate* layers and parallel to each other; a plurality of bit lines disposed on the selection lines, and the bit lines arranged in parallel to each other and in perpendicular to the selection lines; a plurality of strings formed vertically to the [memory] *gate* layers and the selection lines, and the strings electrically connected to the corresponding selection lines; a plurality of cells respectively defined by the strings, the selection lines and the bit lines correspondingly, and the cells arranged in a plurality of rows and columns, wherein a column direction is parallel to the bit lines while a row direction is parallel to the selection lines. The adjacent cells in the same column are electrically connected to the different bit lines.

The disclosure will become apparent from the following detailed description of the preferred but non-limiting embodiments. The following description is made with reference to the accompanying drawings.

DETAILED DESCRIPTION

The embodiments of the present disclosure disclosed below are for elaborating a high speed three-dimensional (3D) semiconductor device, such as a vertical-channel (VC) 3D semiconductor device. According to the structure of the 3D semiconductor device of the embodiments, all of the cells can be read at the same time, which increases the operation speed. Additionally, the bandwidth of the 3D semiconductor device is enlarged (increased), the power consumption is reduced, and the disturbance between adjacent cells during reading is also reduced.

Figure 1:
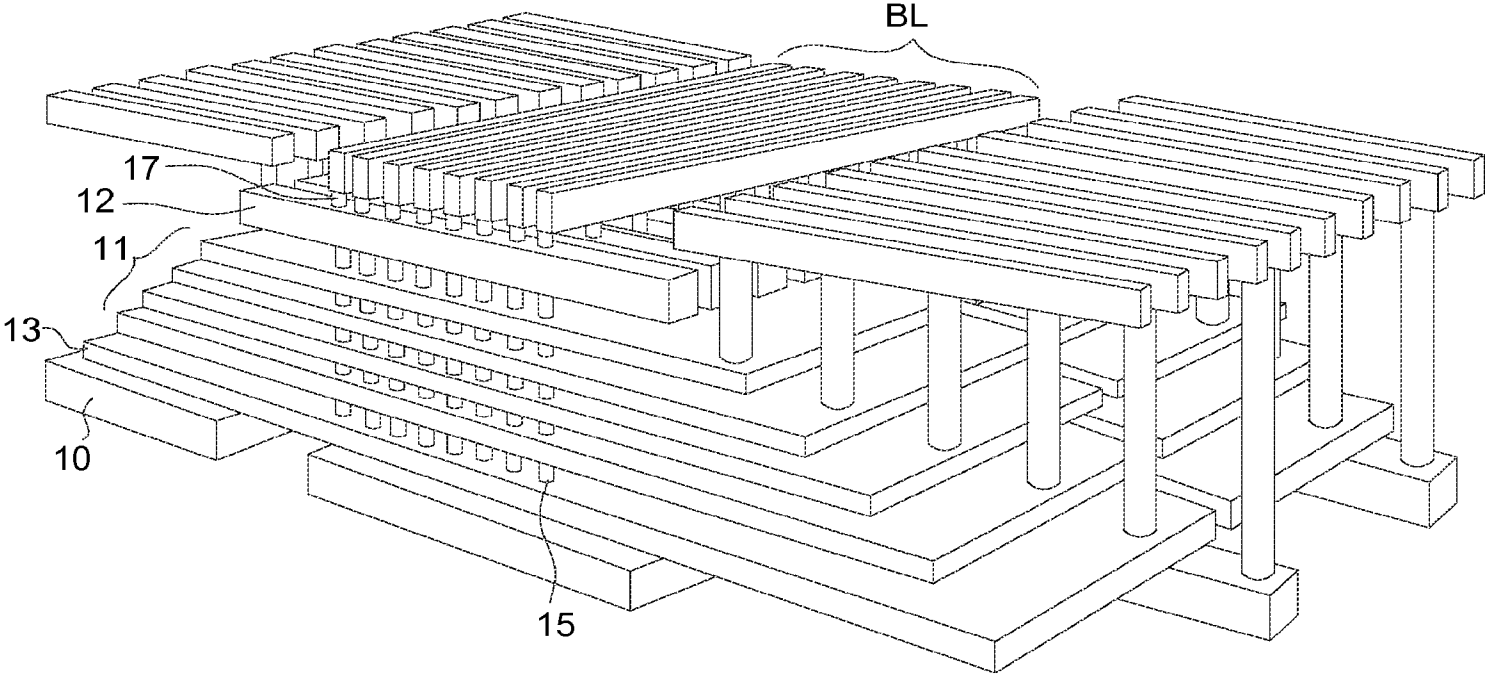
FIG. 1 illustrates a perspective view of a 3D semiconductor device.

The disclosure can be applied to various applications with different cell arrays of 3D semiconductor devices, such as a vertical-channel (VC) 3D semiconductor device. FIG. 1 illustrates a perspective view of a 3D semiconductor device. A 3D semiconductor device comprises a plurality of [memory] *gate* layers 11 (comprising control gates) vertically stacked on a substrate 10 and parallel to each other; a plurality of selection lines 12 disposed on the [memory] *gate* layers and parallel to each other; a plurality of strings 15 formed vertically to the [memory] *gate* layers 11 and the selection lines 12. The strings 15 are electrically connected to the corresponding selection lines 12. Also, the 3D semiconductor device comprises a plurality of bit lines BLs disposed on the selection lines 12, and the bit lines BLs are arranged in parallel to each other and in perpendicular to the selection lines 12. A plurality of cells, respectively defined by the strings 15, the selection lines 12 and the bit lines BLs correspondingly, are arranged in a plurality of rows and columns to form a memory array. Also, a plurality of string contacts 17 are formed vertically to the [memory] *gate* layers [12] *11* and the selection lines 12, and each of the string contacts 17 is disposed correspondingly at each of the strings 15 of the cells, wherein the string contacts 17 are electrically connected to the corresponding selection lines 12 and the corresponding bit lines BLs. The 3D semiconductor device may comprise other known elements; for example, the selection lines 12 are the upper select lines (upper SG), and the lower select lines (lower SG) 13 are further formed under the [memory] *gate* layers 11.

According to the embodiments of the disclosure, the adjacent cells in the same column are electrically connected to the different bit lines.

Two of the applications, such as the cells in a matrix array (i.e. the cells in adjacent rows and in adjacent columns are arranged in a matrix) and cells in a honeycomb array (i.e. the cells in adjacent rows and in adjacent columns are misaligned), are exemplified below for illustration the embodiments of the disclosure. However, the disclosure is not limited to those types of cell arrays.

According to the first, second and third embodiments, the cells in adjacent rows and in adjacent columns are arranged as a matrix (so-called as matrix array). According to the fourth, fifth and sixth embodiments, the cells in adjacent rows and in adjacent columns are arranged in a honeycomb array. The detailed constructions disclosed in those embodiments of the disclosure are for illustration only, not for limiting the scope of protection of the disclosure.

Embodiments are provided hereinafter with reference to the accompanying drawings for describing the related configurations and procedures, but the present disclosure is not limited thereto. The identical and/or similar elements of the embodiments are designated with the same and/or similar reference numerals. Also, it is noted that there may be other embodiments of the present disclosure which are not specifically illustrated. It is also important to point out that the illustrations may not be necessarily be drawn to scale. Thus, the specification and the drawings are to be regard as an illustrative sense rather than a restrictive sense.

Cells in a Matrix Array

In the first, second and third embodiments, the cells in adjacent rows and in adjacent columns are arranged as a matrix (so-called as matrix array). Also, those embodiments illustrate that the string contacts 17 of the cells in a matrix array are electrically connected to the corresponding bit lines BLs through a patterned metal layer and a plurality of conductive vias.

First Embodiment

Figure 2:
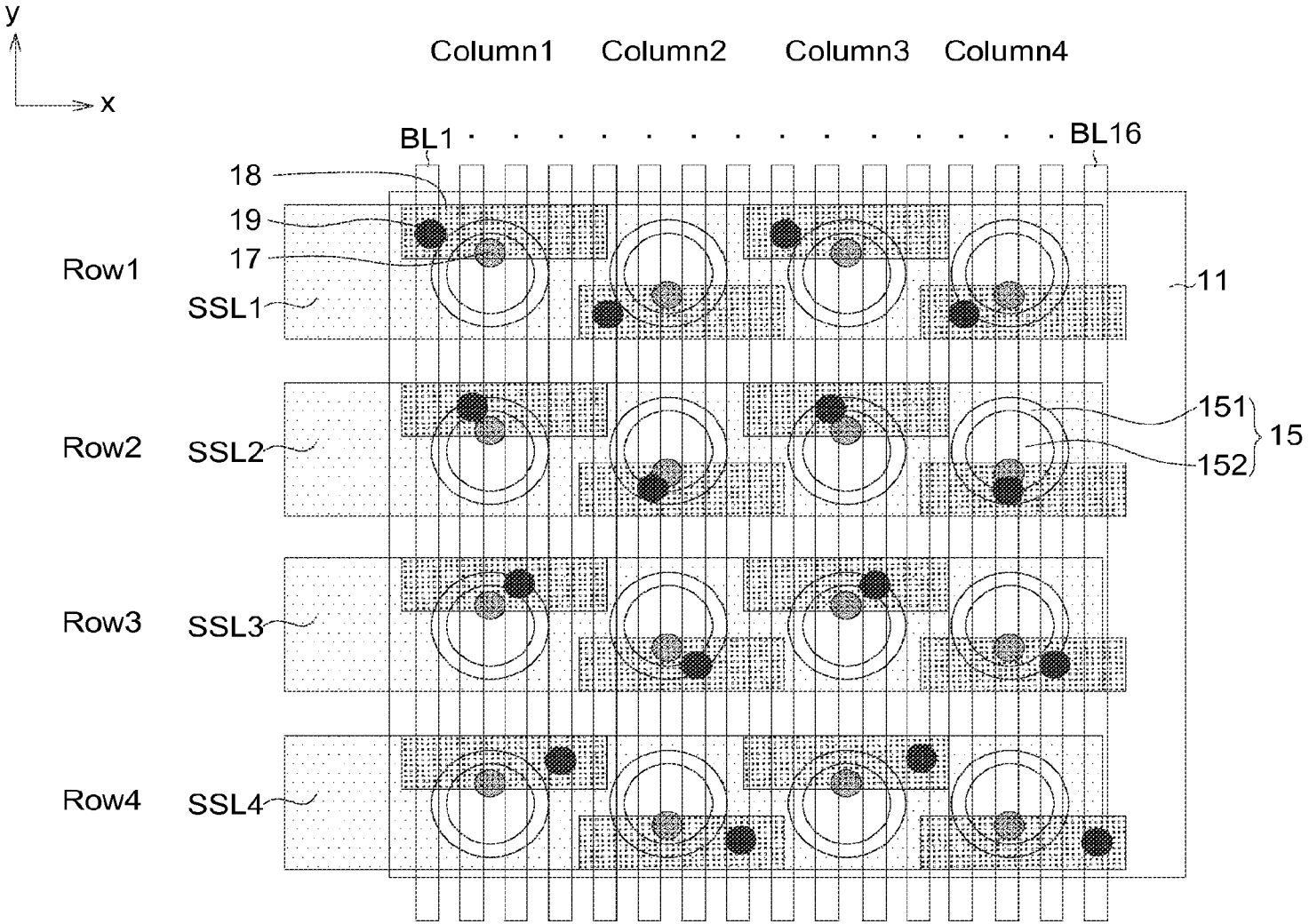
FIG. 2 is a top view of a cell design of the 3D semiconductor device according to the first embodiment of the present disclosure.

FIG. 2 is a top view of a cell design of the 3D semiconductor device according to the first embodiment of the present disclosure. Please also refer to FIG. 1 for the perspective view of a 3D semiconductor device and descriptions of the [memory] *gate* layers 11, the selection lines 12, the strings 15, the string contacts 17 and the bit lines BLs.

A plurality of cells, respectively defined by the strings 15, the selection lines 12 and the bit lines BLs correspondingly, are arranged in a plurality of rows and columns to form a memory array. According to the embodiment, the cells arranged in a plurality of rows and columns, wherein the columns (/column direction, along [x-direction] *y-direction*) are parallel to the bit lines BLs (ex: BL1~BL16) while the rows (/row direction, along [y-direction] *x-direction*) are parallel to the selection lines (such as the SSL1~SSL4). Also, each string 15 of the cell, comprising a [channel] *storage* layer 151 (such as an ONO layer) surrounding a conductive layer 152, is illustrated for exemplifying the embodiment. However, the disclosure is not limited thereto.

According to the first embodiment, the adjacent cells in the same column are electrically connected to the different bit lines. Take the cells in the first column of FIG. 2 as an example, the adjacent cells in the first row and in the second row are electrically connected to the bit lines BL1 and BL2, respectively.

Also, in the first embodiment, four bit lines are disposed correspondingly to the cells arranged in the same column. For example, the bit lines BL1 to BL4 are disposed correspondingly to the cells arranged in the first column, as shown in FIG. 2.

Additionally, the positions of the string contacts 17 of the first embodiment are correspondingly shifted away from the centers of the strings 15 of the cells. As shown in FIG. 2, the positions of the string contacts 17 are positioned correspondingly at an upper portion of the strings 15 or at a lower portion of the strings 15.

Furthermore, in the first embodiment, the adjacent string contacts 17 of the cells arranged in the same row are misaligned. Take the cells in the first row of FIG. 2 as an example, the adjacent string contacts 17 in the first column and in the second column are misaligned.

Figure 3A:
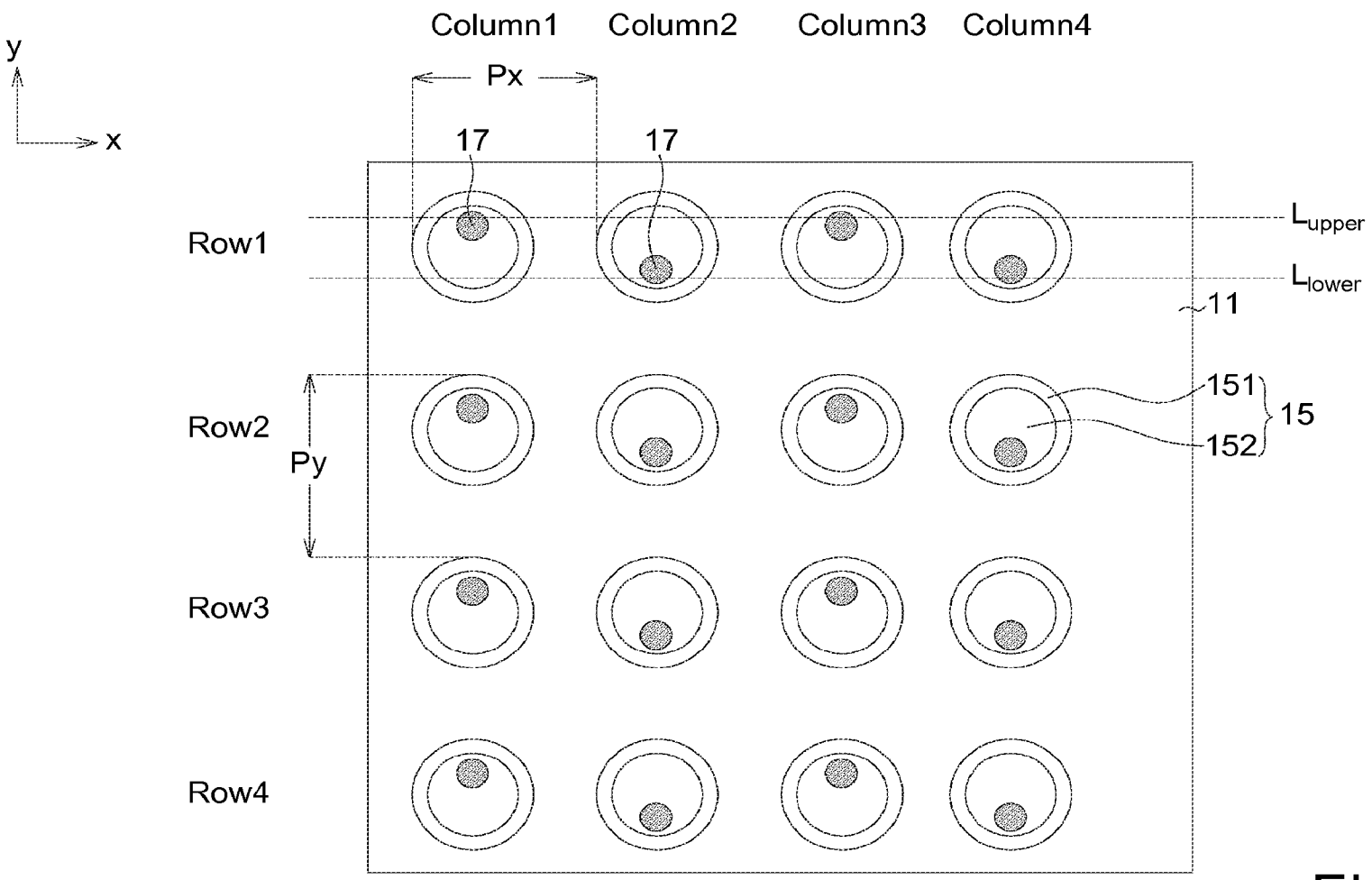
FIG. 3A depicts an arrangement of the string contacts of the cells in a matrix array according to the first embodiment of the disclosure.

Also, for the string contacts 17 of the cells arranged in the same row, every other string contact 17 (such as the string contacts 17 in the first and third columns) is aligned to form a straight line along a row direction. Please also refer to FIG. 3A, which depicts an arrangement of the string contacts of the cells in a matrix array according to the first embodiment of the disclosure. The string contacts 17 of the cells arranged in the same row are aligned at a first straight line (such as the upper line $L_{upper}$) and a second straight line (such as the lower line $L_{lower}$) along a row direction (i.e. x-direction), and the first straight line is positioned correspondingly to the upper portions of the strings 15, while the second straight line is positioned correspondingly to the lower portions of the strings 15. Therefore, according to the positions of the string contacts 17, the string contacts 17 of the cells arranged in the same row can be divided into two groups. The first and second groups are composed of the string contacts at the odd-numbered columns (the first column, the third column, . . . ) and the string contacts at the even-numbered columns (the second column, the fourth column . . . ), respectively. The odd-numbered string contacts 17 are aligned along the upper line $L_{upper}$, and the even-numbered string contacts 17 are aligned along the lower line $L_{lower}$.

Also, in the first embodiment, the string contacts 17 of each row (Row1, or Row2, or Row3 or Row4) are electrically connected to one of the selection lines, such as the SSL1 or SSL2 or SSL3 or SSL4, as shown in FIG. 2. However, the disclosure is not limited thereto. In other embodiments, the string contacts of at least two adjacent rows, such as the string contacts of four rows, are electrically connected to one of the selection lines (illustrate in the second and third embodiments later).

Also, when the cells are arranged in a matrix array, as illustrated in the first embodiment, the string contacts 17 are electrically connected to the corresponding bit lines (such as BL1/BL2/ . . . /BL16) through a patterned metal layer and a plurality of conductive vias 19, as shown in FIG. 2. The patterned metal layer comprises a plurality of metal portions 18 respectively formed on the corresponding string contacts 17 of the cells, and each of the conductive vias 19 formed on each of the metal portions 18 is electrically connected to the corresponding bit line (such as BL1/BL2/ . . . /BL16).

Figure 3B:
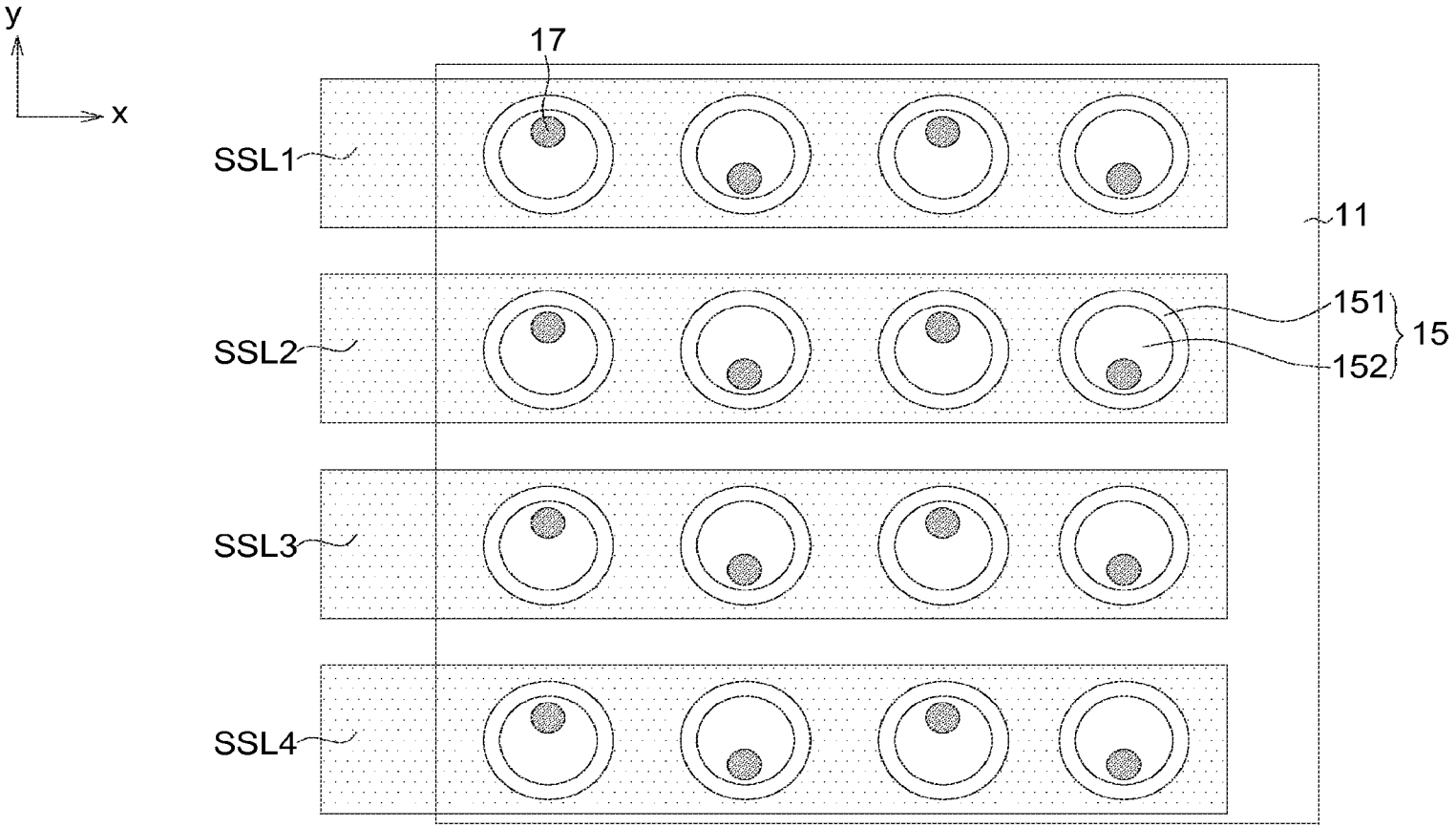
FIG. 3B~FIG. 3D illustrate an implementation of the electrical connection between the string contacts and the corresponding bit lines according to the first embodiment of the disclosure.
Figure 3C:
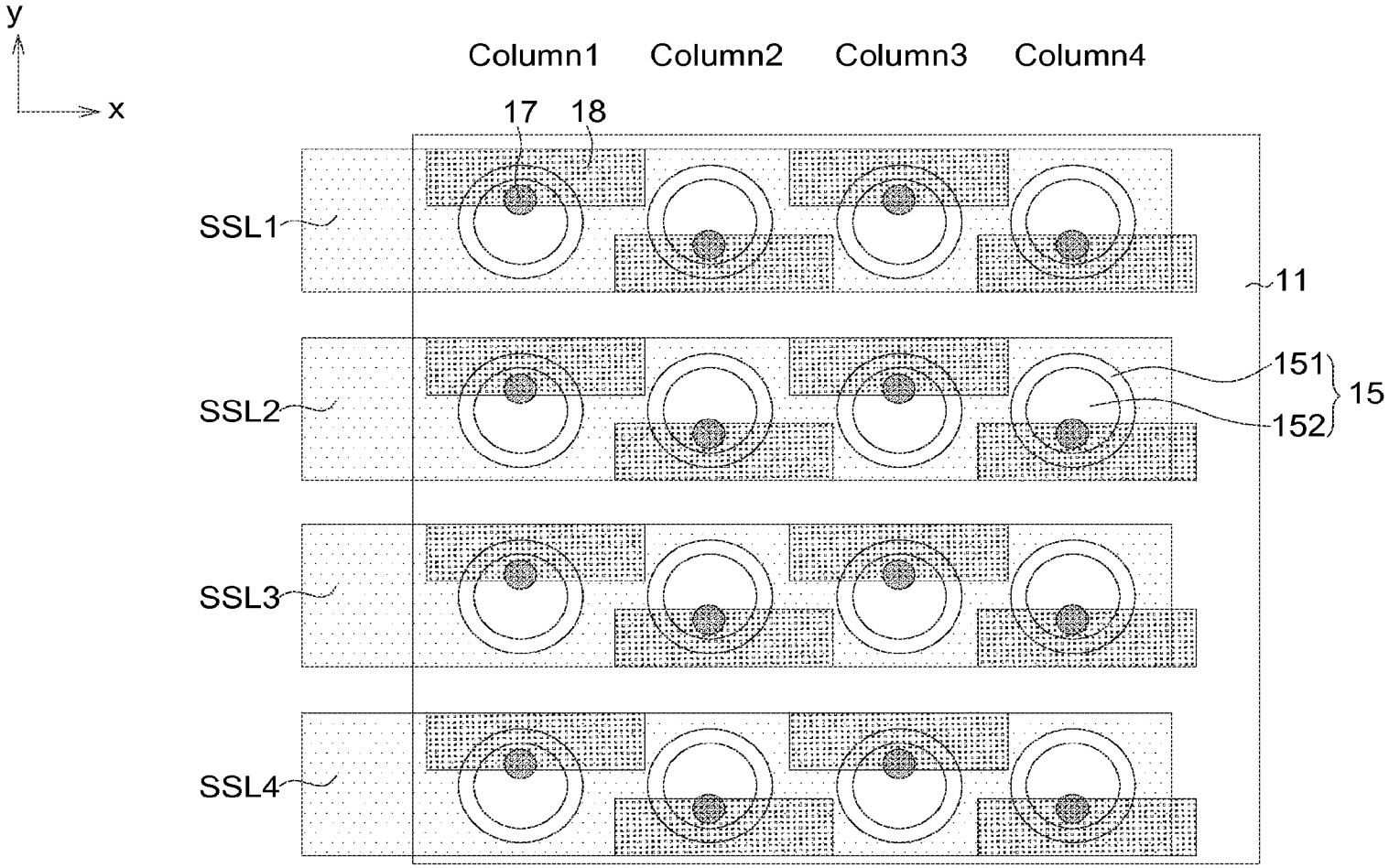
Figure 3D:
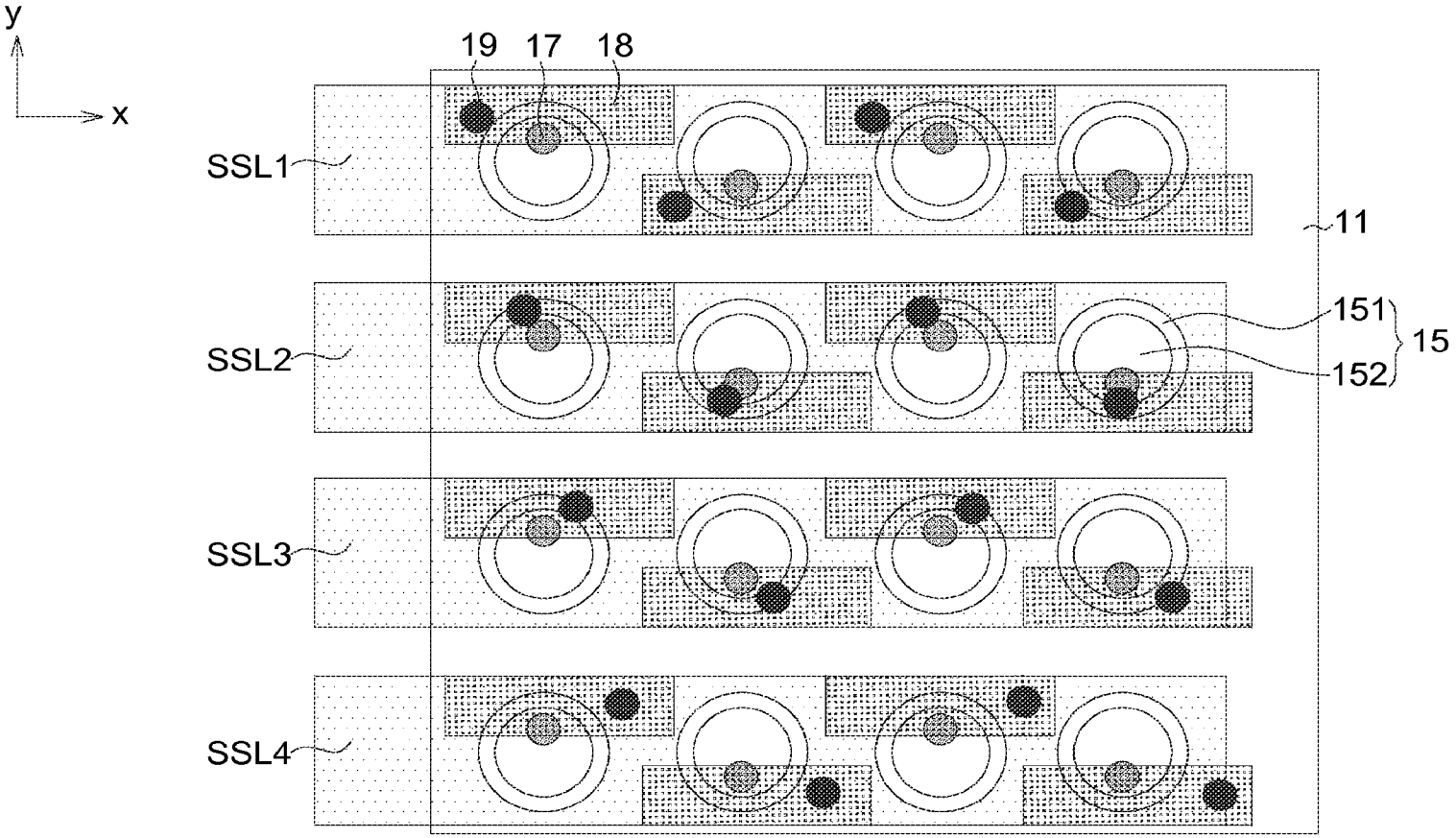

FIG. 3B~FIG. 3D illustrate an implementation of the electrical connection between the string contacts and the corresponding bit lines according to the first embodiment of the disclosure. After a structure with [memory] *gate* layers [12] *11*, the selection lines 12 (ex: SSL1~SSL4), the strings 15 (each comprising the [channel] *storage* layer 151 and the conductive layer 152 for example) and the string contacts 17 as shown in FIG. 3B is provided, a patterned metal layer comprising plural metal portions 18 is formed, and each of metal portions 18 respectively corresponds each of string contacts 17 of the strings 15, as shown in FIG. 3C. The conductive vias 19 are formed on the metal portions 18 correspondingly, as shown in FIG. 3D. Then, the bit [line] *lines* (such as BL1/BL2/ . . . /BL16) are formed at the corresponding conductive vias 19 to form the configuration as shown in FIG. 2, thereby building the electrical connection between the bit lines and the string contacts 17 correspondingly.

In one embodiment, a distance between the adjacent cells along the row direction is defined as a cell pitch ($P_X$), m of the rows of the cells are arranged in one of the selection lines, and n of the bit lines are positioned corresponding to the cell pitch ($P_X$), wherein m≥2, and m=n. According to the illustration of FIG. 2 (and FIGS. 4 and 5 described later), m=n=4.

According to the description above, the cells in the same row (such as the first row, or the second row, . . . etc) of the first embodiment are electrically connected to one of the selection lines (such as the SSL1, the SSL2, the SSL3 or the SSL4), as shown in FIG. 2. However, the embodiment is not limited there to. It is also applicable that the cells of at least two adjacent rows are electrically connected to one of the selection lines. In the following embodiments, the cells of at least two adjacent rows are electrically connected to one of the selection lines.

Second Embodiment

Figure 4:
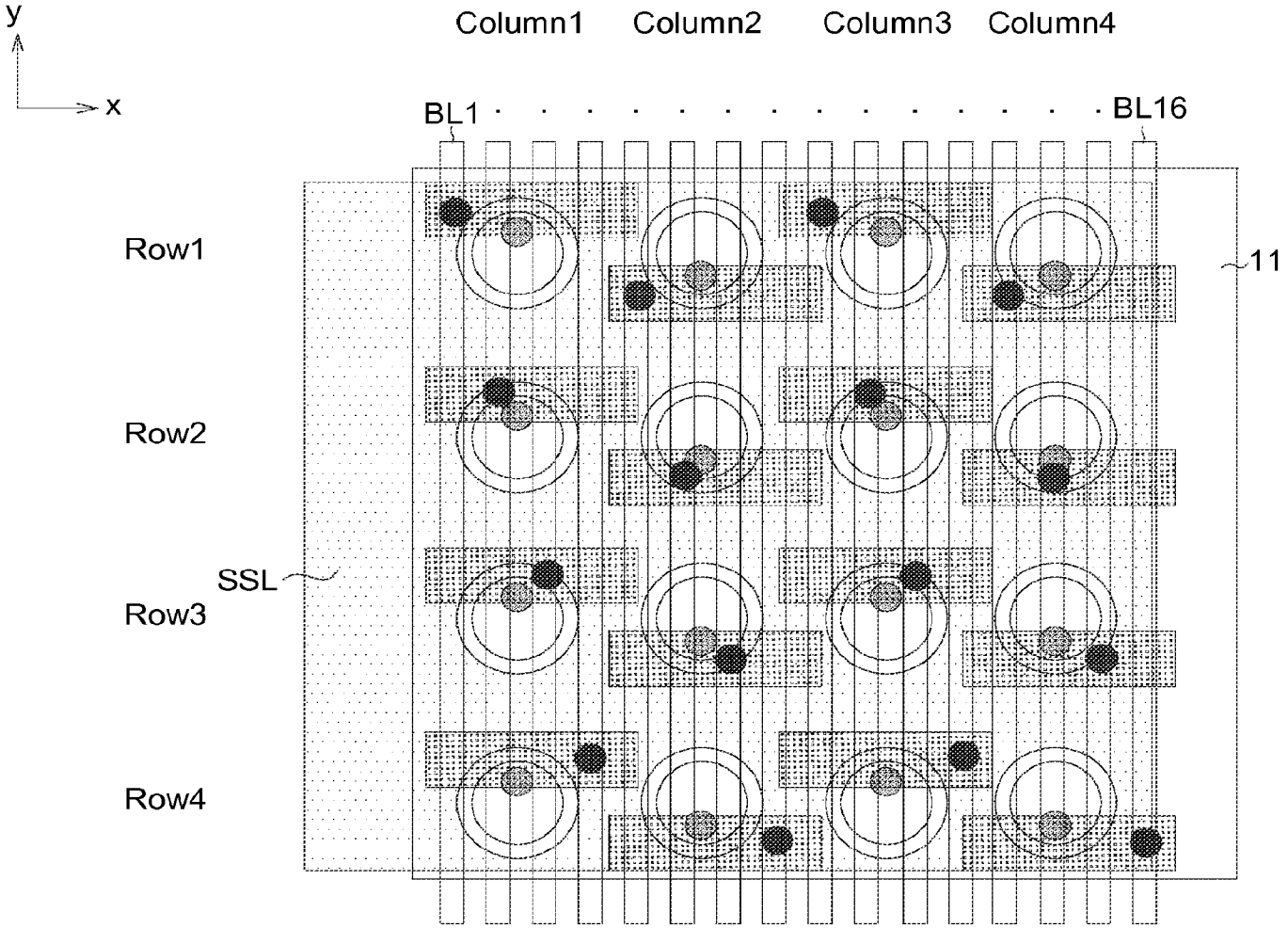
FIG. 4 is a top view of a cell design of the 3D semiconductor device according to the second embodiment of the present disclosure.

FIG. 4 is a top view of a cell design of the 3D semiconductor device according to the second embodiment of the present disclosure. Please also refer to FIG. 2 and the related description for the identical elements of the first and second embodiments, which are not redundantly described herein.

The difference of the devices in the first and second embodiments is the number of the cell rows coupled to the selection line. In the second embodiment, the cells of four adjacent rows (such as the first row to the fourth row) are electrically connected to one of the selection lines, such as the SSL shown in FIG. 4. With the design of the disclosure, the decoding of the device can be supported by less SSL, which simplifies the manufacture and enlarges the process window.

Third Embodiment

Figure 5:
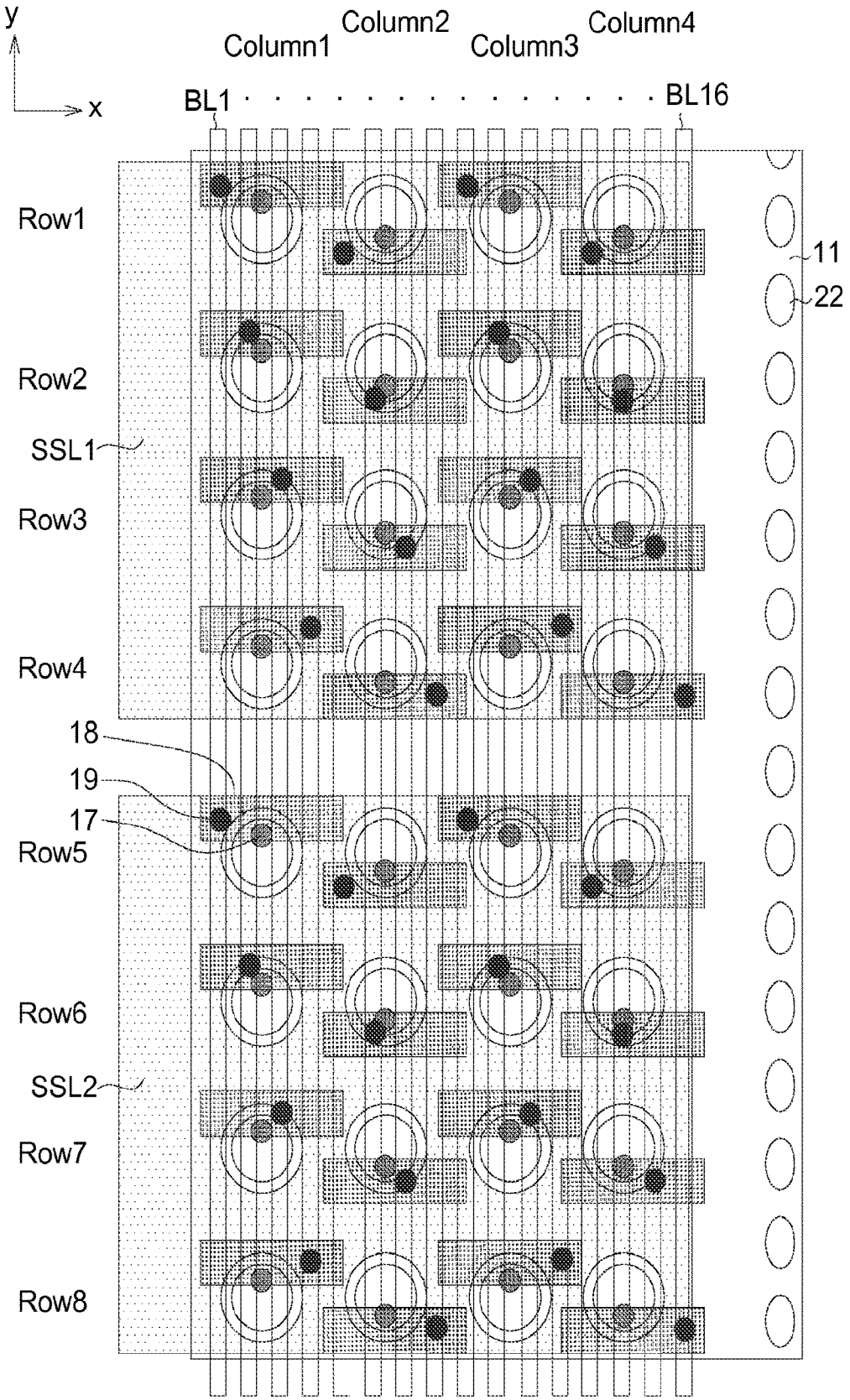
FIG. 5 is a top view of a cell design of the 3D semiconductor device according to the third embodiment of the present disclosure.

FIG. 5 is a top view of a cell design of the 3D semiconductor device according to the third embodiment of the present disclosure. Please also refer to FIG. 2 and the related description for the identical elements of the first and third embodiments, which are not redundantly described herein.

The difference of the devices in the first and third embodiments is the number of the cell rows coupled to the selection line. In the third embodiment, the cells of four adjacent rows are electrically connected to one of the selection lines. As shown in FIG. 5, the cells of the first row to the fourth row (Row1~Row4) are electrically connected to the selection line SSL1, and the cells of the fifth row to the eighth row (Row5~Row8) are electrically connected to the selection line SSL2. The device of FIG. 5 also depicts several staircase contacts 22 at the [memory] *gate* layers [12] *11*. As illustrated in the third embodiment, this design of the disclosure also supports the application with too many staircase contacts 22, and the layer for making the selection lines can be divided to form a couple the selection lines, such as SSL1 and SSL2 separately upon the [memory] *gate* layers [12] *11*, and it is no need to form too many selection lines corresponding to each row of the cells.

Design of the Pattern Metal Layer

According to the descriptions of the first to third embodiments, the pattern metal layer (for the purpose of electrically connecting the cell to the corresponding bit line) includes the metal portions 18, each having a rectangular cross-sectional area. As shown in FIG. 2~FIG. 4, the metal portions 18 (i.e. the rectangular first parts) partially cover the corresponding string contacts 17. However, the disclosure is not limited thereto. Each of the metal portions 18 may comprise a first part and a second part to fully cover the corresponding string contacts 17. Two of the applicable designs of the metal portion 18 are discussed herein with reference of the drawings for the purpose of illustration, but not for limitation.

Figure 6A:
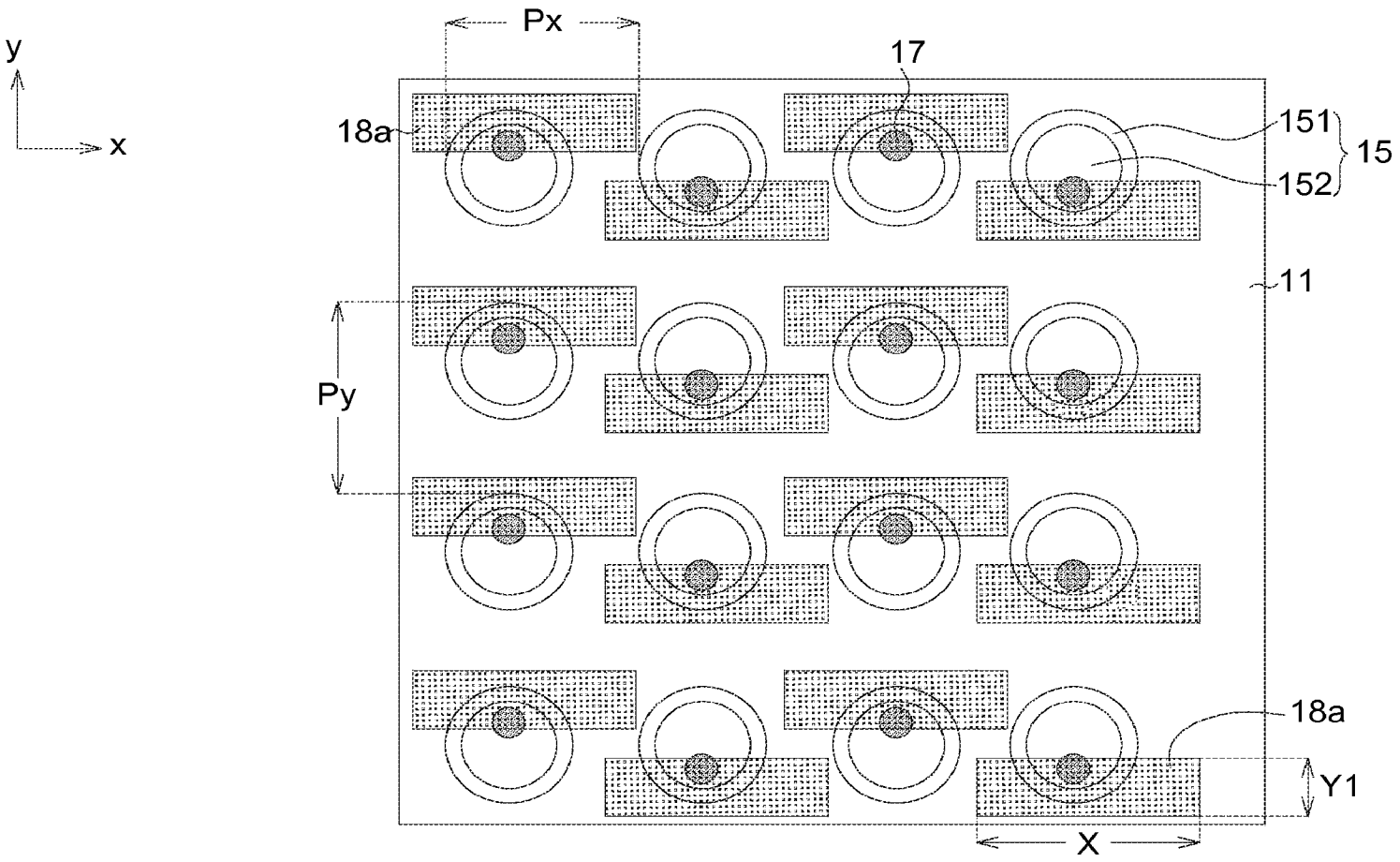
FIG. 6A illustrates an arrangement of the metal portions for partially covering the corresponding string contacts of the cells in matrix according to an embodiment of the disclosure.
Figure 6B:
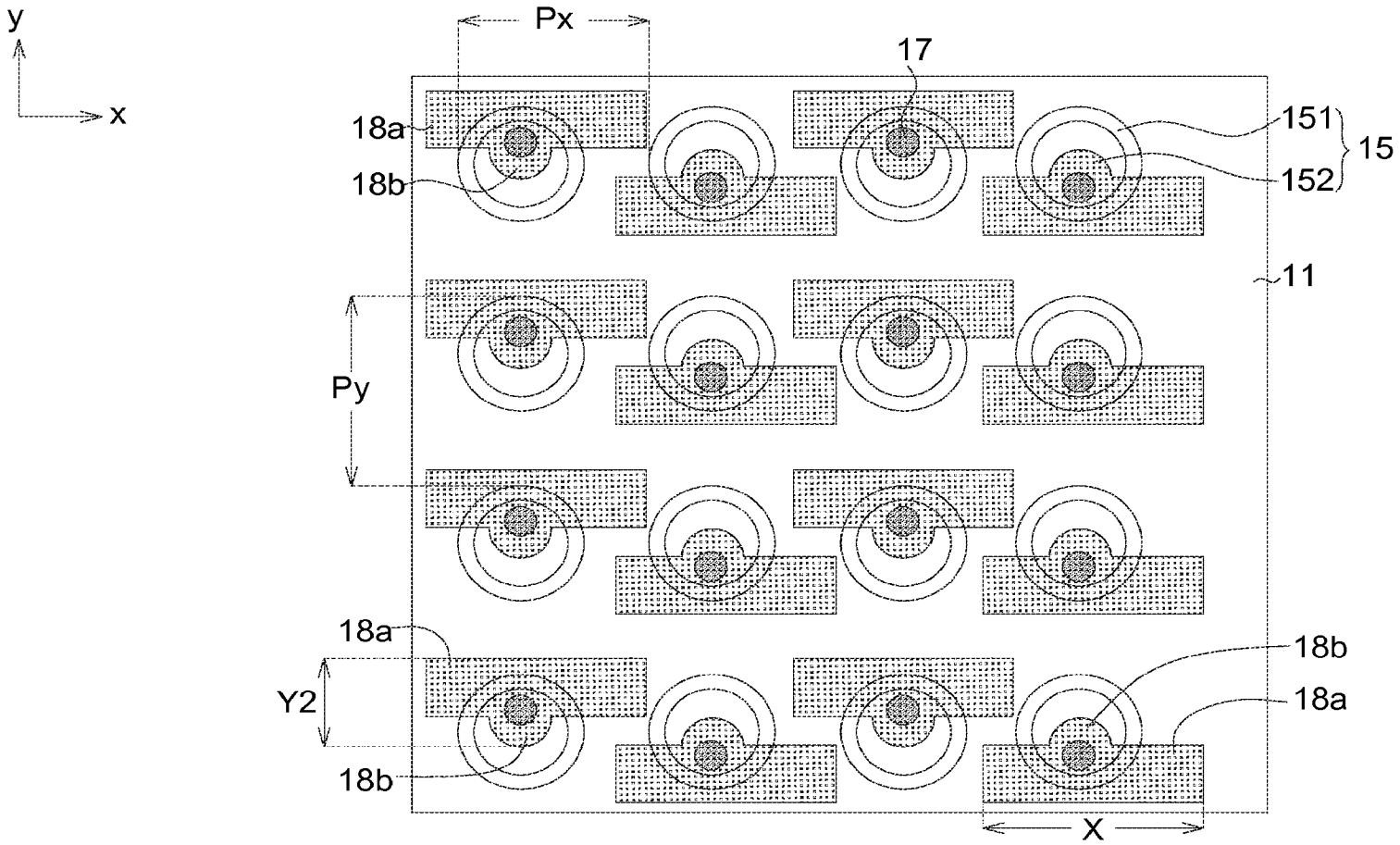
FIG. 6B illustrates an arrangement of the metal portions fully covering the corresponding string contacts of the cells in matrix according to another embodiment of the disclosure.

FIG. 6A illustrates an arrangement of the metal portions for partially covering the corresponding string contacts of the cells in matrix according to an embodiment of the disclosure. FIG. 6B illustrates an arrangement of the metal portions fully covering the corresponding string contacts of the cells in matrix according to another embodiment of the disclosure.

As shown in FIG. 6A and FIG. 6B, the adjacent metal portions 18 of the cells in the same row are misaligned. For example, the metal portions 18 of the cell in the first and the third columns are positioned at the upper portions of the cells, while the metal portions 18 of the cell in the second and the fourth columns are positioned at the lower portions of the cells. Also, those metal portions 18 are separately positioned at the corresponding cells without space interference by adequate profile design.

A distance between the two adjacent cells along a row direction is defined as a cell pitch $P_X$, while a distance between the two adjacent cells along a column direction is defined as a cell pitch $P_y$. As shown in FIG. 6A, one of the metal portions 18, for partially covering the corresponding string contacts 17 of the cells, has a rectangular shape with a size of X in width parallel to the row direction (x-direction) and $Y_1$ in length parallel to the column direction (y-direction), wherein $X>P_X$, $X<2P_X$, and $Y_1<1/2P_y$.

As shown in FIG. 6B, one of the metal portions 18, for fully covering the corresponding string contacts 17 of the cells, comprises a first part 18a and a second part 18b connected to the first part 18a. The shape of the second part 18b is not limited. Shape examples of the second part 18b include half-circled, or rectangular, or squared or irregular in shape, which are not limited particularly, as long as the combination of the first and second parts is capable of fully covering the corresponding string contact 17. In FIG. 6B, a half-rounded shape of the second part 18b is depicted. Any shape of the second part 18b able to fully cover the exposed portion of the string contact 17 from the first part 18a can be adopted. The first part 18a and the second part 18b in sum has an overall length $Y_2$ parallel to the column direction, wherein $Y_2>1/2P_y$.

According to the structures of the 3D semiconductor devices as illustrated in the embodiments above, all of the cells can be read at the same time. Additionally, the bandwidth of the 3D semiconductor device is enlarged, the power consumption is reduced, and the disturbance between adjacent cells during reading is also reduced.

Cells in a Honeycomb Array

In the fourth, fifth and sixth embodiments, the cells in adjacent rows and in adjacent columns are arranged in a honeycomb array. honeycomb design may support higher memory density. Also, those embodiments illustrate that the string contacts 17 of the cells in a honeycomb array are directly connected to the corresponding bit lines BLs (without the metal portions 18 and the conductive vias 19 in the first to third embodiments). According to the cell designs of the fourth, fifth or sixth embodiment, no extra metal (ex: metal portions 18 and conductive vias 19) is required and the bandwidth can be doubled easily.

Fourth Embodiment

Figure 7:
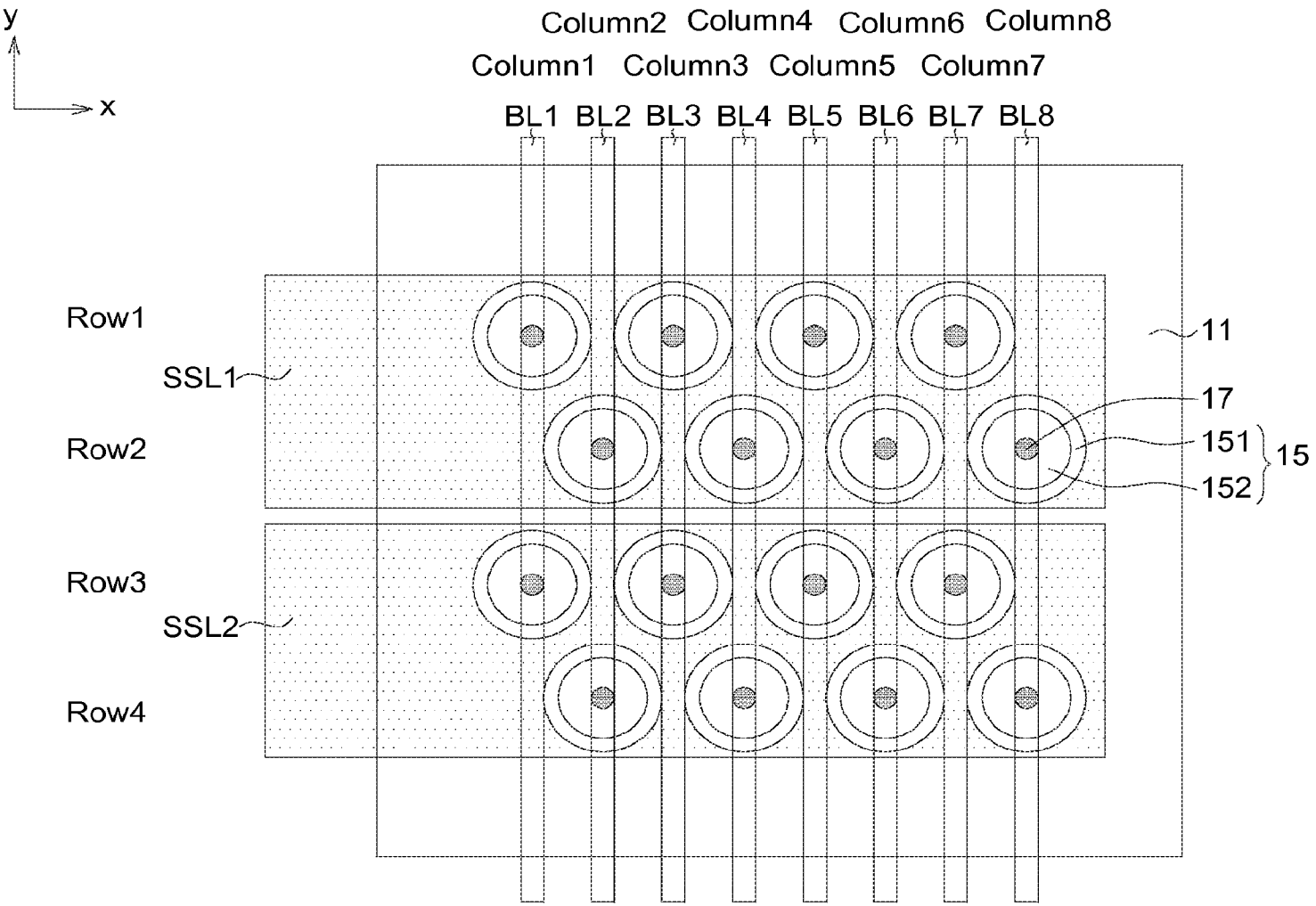
FIG. 7 is a top view of a cell design of the 3D semiconductor device according to the fourth embodiment of the present disclosure.

FIG. 7 is a top view of a cell design of the 3D semiconductor device according to the fourth embodiment of the present disclosure. Please also refer to FIG. 1 for the perspective view of a 3D semiconductor device and descriptions of the [memory] *gate* layers 11, the selection lines 12, the strings 15, the string contacts 17 and the bit lines BLs. In FIG. 7, the cells in adjacent rows (such as Row1~Row4) and in adjacent columns (such as Column1~Column8) are arranged in a honeycomb array.

According to the fourth embodiment, the adjacent cells in the [same column] *adjacent columns* are electrically connected to the different bit lines. Take the cells in the first column (Column 1) *and the second column* (*Column 2*) of FIG. 7 as an example, the adjacent cells in the first row (Row1) and in the second row (Row2) are electrically connected to the bit lines BL1 and BL2.

In the fourth embodiment, each of bit lines (such as BL1~BL8) is disposed correspondingly to the cells arranged in the same column. The positions of the string contacts 17 of the fourth embodiment are corresponding to the centers of the cells. Also, each of the selection lines corresponds to the cells in two adjacent rows. As shown in FIG. 7, the selection line SSL1 corresponds to the cells in the adjacent Row1 and Row2, while the selection line SSL2 corresponds to the cells in the adjacent Row3 and Row4.

Furthermore, in the fourth embodiment, the adjacent string contacts 17 of the cells arranged in the [same column] *adjacent columns* are misaligned. Take the cells in the first column (Column 1) *and the second column* (*Column 2*) of FIG. 7 as an example, the adjacent string contacts 17 in the first row (Row1) and in the second row (Row2) are misaligned.

Also, for the string contacts 17 of the cells of the honeycomb array arranged in the same column, at least every other string contact is aligned to form a straight line along a column direction (y-direction). Take the cells in the first column (Column 1) of FIG. 7 as an example, the string contacts 17 in the first row (Row1) and in the third row (Row3) are aligned to form a straight line along a column direction.

For the cells arranged as the honeycomb array, the positions of the string contacts 17 can be corresponding to the centers of the cells as depicted in FIG. 7, and also can be shifted from the centers of the cells as described below.

Fifth Embodiment

Figure 8:
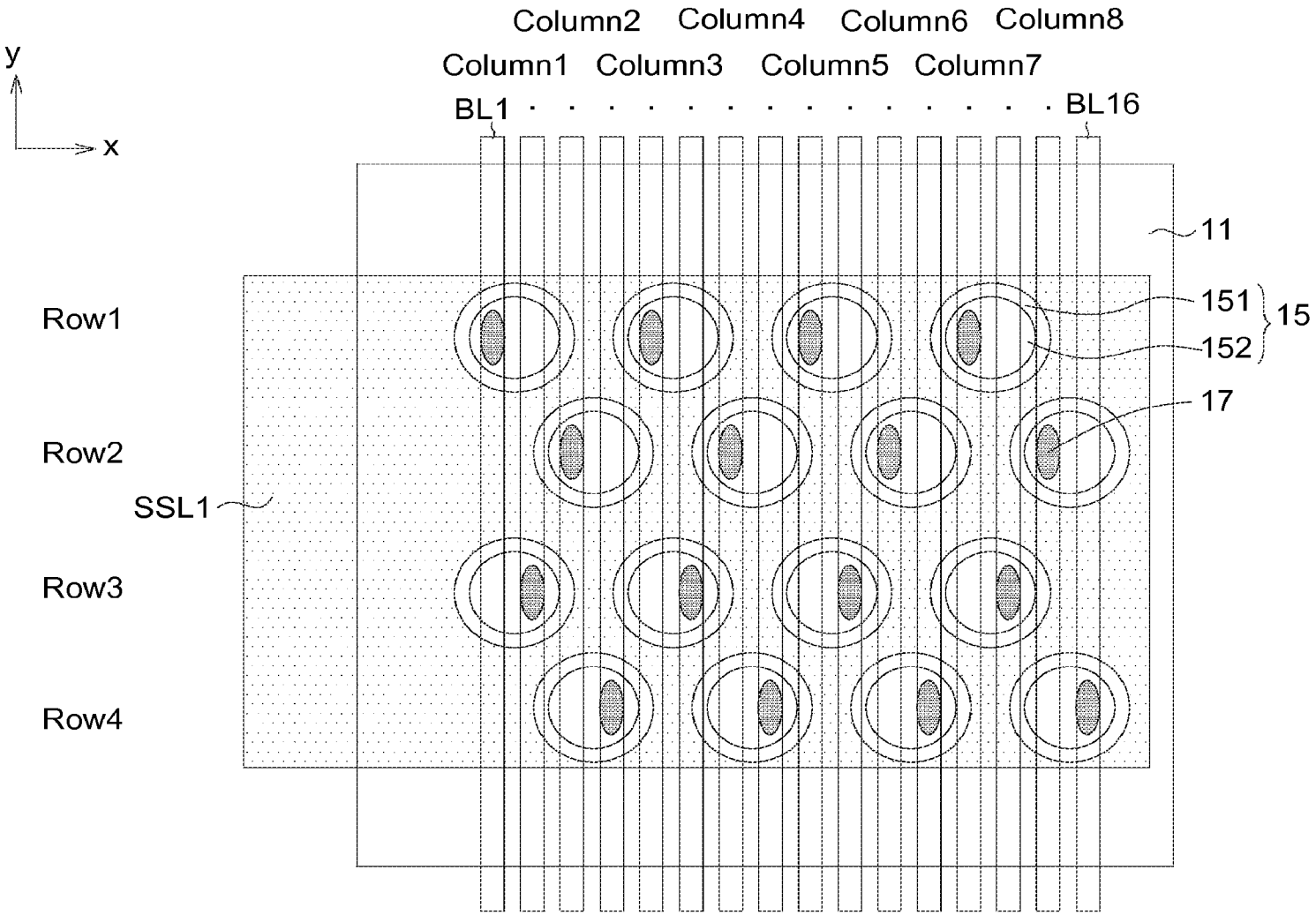
FIG. 8 is a top view of a cell design of the 3D semiconductor device according to the fifth embodiment of the present disclosure.

FIG. 8 is a top view of a cell design of the 3D semiconductor device according to the fifth embodiment of the present disclosure. Please also refer to FIG. 1 for the perspective view of a 3D semiconductor device and descriptions of the [memory] *gate* layers 11, the selection lines 12, the strings 15, the string contacts 17 and the bit lines BLs. In FIG. 8, the cells in adjacent rows (such as Row1~Row4) and in adjacent columns (such as Column1~Column8) are arranged in a honeycomb array.

Also, the positions of the string contacts 17 of the fifth embodiment are shifted away from the centers of the cells, such as shifted to left and right. As shown in FIG. 8, for the string contacts of the cells in the same column (such as Column 1, or Column 2), the string contacts 17 of the cells in every other rows (such as Row1 and Row 3, or Row2 and Row 4) are shifted to a left position and a right position, respectively. Accordingly, the adjacent two bit lines (such as BL1 and BL2) are disposed along the left position and a right position of the cells in the same column (such as Column 1), respectively.

According to the fifth embodiment, the adjacent cells in the same column are electrically connected to the different bit lines. Take the cells in the first column (Column 1) of FIG. 8 as an example, the adjacent cells in the first row (Row1) and in the [second] *third* row (Row[2]*3*) are electrically connected to the bit lines BL1 and BL2. Therefore, in the fifth embodiment, two of the bit lines (such as BL1~BL16) is disposed correspondingly to the cells arranged in the same column.

According to the cell designs of the fifth embodiment, no extra metal (ex: metal portions 18 and conductive vias 19) is required, and the bandwidth can be doubled easily. Also, the shifted positions of the string contacts 17 of the fifth embodiment double the bandwidth of the device than the device of the fourth embodiment.

Furthermore, in the fifth embodiment, the adjacent string contacts 17 of the cells arranged in the same column are misaligned. Take the cells in the first column (Column 1) of FIG. 8 as an example, the adjacent string contacts 17 in the first row (Row1) and in the [second] *third* row (Row[2]*3*) are misaligned.

Also, the cells of four adjacent rows (such as Row1~Row4) are electrically connected to one of the selection lines (such as SSL1) via the string contacts 17 according to the fifth embodiment.

Sixth Embodiment

Figure 9:
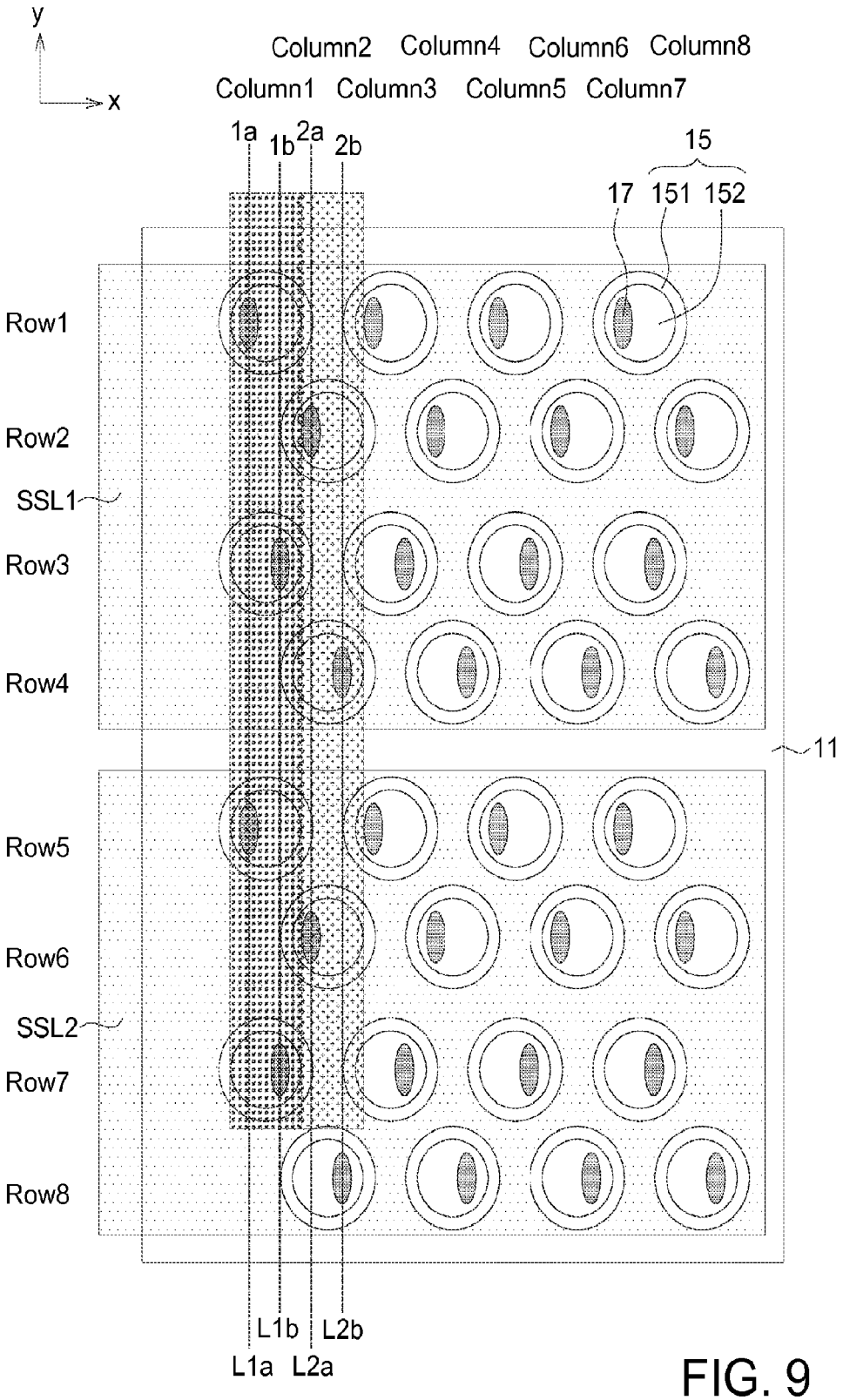
FIG. 9 is a top view of a cell design of the 3D semiconductor device according to the sixth embodiment of the present disclosure.

FIG. 9 is a top view of a cell design of the 3D semiconductor device according to the sixth embodiment of the present disclosure. In FIG. 9, the cells in adjacent rows (such as Row1~Row8) and in adjacent columns (such as Column1~Column8) are arranged in a honeycomb array. Please also refer to FIG. 8 and the related description for the identical elements of the fifth embodiments, which are not redundantly described herein.

The identical element of the fifth and six embodiments, such as the shifted positions of the string contacts 17; adjacent string contacts 17 of the cells in the same column being misaligned; the adjacent cells in the same column electrically connected to the different bit lines; two of the bit lines disposed correspondingly to the cells arranged in the same column, have been described in details in the fifth embodiment, and are not redundantly repeated again.

The devices of the fifth and sixth embodiments show four and eight of the cell rows, respectively. Similar to the fifth embodiment, the cells in four adjacent rows (such as the Row1 to Row 4, the first row to the fourth row) are electrically connected to one of the selection lines (ex: the cells in the Row1 to Row 4 are electrically connected to SSL1, while the cells in the Row5 to Row 8 are electrically connected to SSL2). With the design of the disclosure, the decoding of the device can be supported by less SSL, which simplifies the manufacture and enlarges the process window.

Also, for the string contacts 17 of the cells of the honeycomb array arranged in the same column, every other [three] string [contacts are] *contact is* aligned to form a straight line along a column direction (y-direction). Take the cells in the first column (Column 1) of FIG. 9 as an example, the string contacts 17 in the first row (Row1) and in the fifth row (Row5) are aligned to form a straight line along a column direction.

As shown in FIG. 9, according to the positions of the string contacts 17, the string contacts 17 of the cells arranged in the same column can be divided into two groups in the sixth embodiment. For the same column such as the first column (Column 1), the string contacts 17 at the first row (Row1) and the fifth row (Row5) (and the ninth row . . . etc.) compose of a first group of the first column, wherein the string contacts 17 of the first group of the first column (Column 1) are aligned along a line L1a at a position 1a, Also, for the first column (Column 1), the string contacts 17 at the third row (Row3) and the seventh row (Row7) (and the eleventh row . . . etc.) compose of a second group of the first column, and the string contacts 17 of the second group of the first column (Column 1) are aligned along another line L1b at a position 1b. For the second column (Column 2), the string contacts 17 at the second row (Row2) and the sixth row (Row6) (and the tenth row . . . etc.) compose of a first group of the second column, and the string contacts 17 of the first group of the second column are aligned along a line L2a at a position 2a. Also, the string contacts 17 at the fourth row (Row4) and the eighth row (Row8) (and the twelfth row . . . etc.) compose of a second group of the second column, and the string contacts 17 of the second group of the second column are aligned along another line L2b at a position 2b. According to the illustration of the drawings, the lines L1a and L2a (i.e. position-a) are shifted to the left of the centers of the cells, while the lines L1b and L2b (i.e. position-b) are shifted to the right of the centers of the cells. The bit lines (which are omitted from FIG. 9) on the cells are formed correspondingly to the lines L1a and L2a, and L1b and L2b, etc.

According to the cells of the devices arranged as a honeycomb array in the fourth to sixth embodiments, the overlapped regions of the cells in adjacent rows and columns (for example, the right edge of the conductor layer 152 of the cell in the Row 1 and Column 1 overlaps the left edge of the conductor layer 152 of the cell in the Row 2 and Column 2, as shown in FIG. 9) gives the chance to eliminate the use of metal portions 18 and the conductive vias 19 as adopted in the first to third embodiment. Accordingly, the bandwidth of the device in fourth, fifth or sixth embodiment can be doubled easily.

Moreover, although two bit lines disposed along the cells in the same column (ex: positioned correspondingly to the lines L1a and L1b of the cells in Column 1) of FIG. 9, the disclosure is not limited thereto. The number of the bit lines disposed along the cells in the same column could be more than two (ex: 3, 4, 5 . . . ), depending on the requirements of the applications, cost limitation and/or performance of the devices.

Figure 10A:
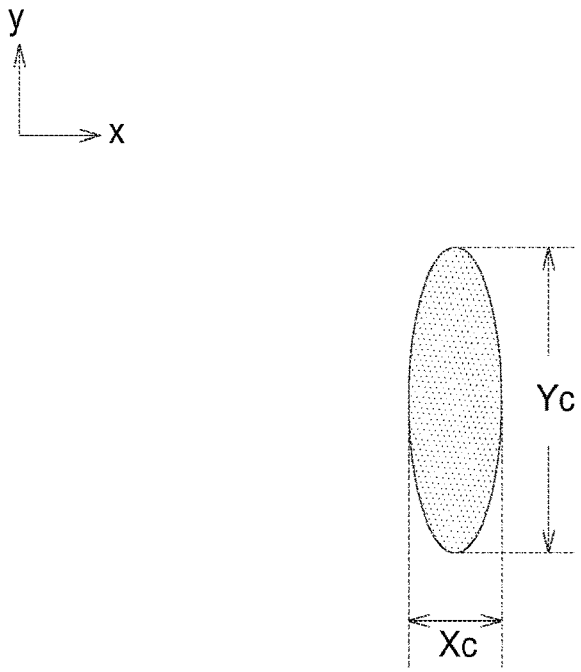
FIG. 10A illustrates a string contact with oval shape according to an embodiment of the disclosure.
Figure 10B:
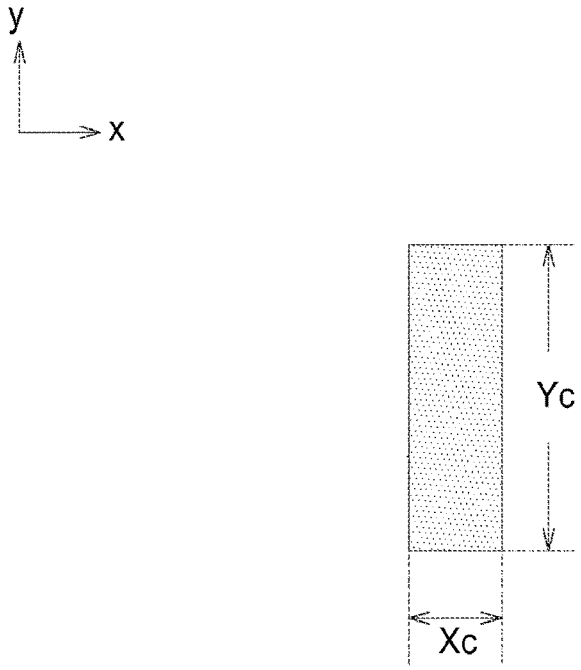
FIG. 10B illustrates a string contact with rectangular shape according to an embodiment of the disclosure.

Furthermore, the shapes of the string contacts 17 in FIG. 8 and FIG. 9 are oval. However, there is no particular limitation for the shape of the string contact in the disclosure. The string contacts could be formed as round, oval, rectangular or other shape. FIG. 10A illustrates a string contact with oval shape according to an embodiment of the disclosure. FIG. 10B illustrates a string contact with rectangular shape according to an embodiment of the disclosure. As shown in FIG. 10A, the string contact has an oval shape with a size of $X_C$ in width parallel to the row direction (x-direction) and $Y_C$ in length parallel to the column direction (y-direction), wherein $Y_C>X_C$, or $Y_C>2X_C$. As shown in FIG. 10B, the string contact has a rectangular shape with $X_C$ in width and $Y_C$ in length, wherein $Y_C>X_C$, or $Y_C>2X_C$.

It is noted that the devices and cell arrays as described above are provided for illustration. The disclosure is not limited to the configurations disclosed above, and the exemplified structures could be adjusted and changed based on the actual needs of the practical applications. According to the structures of the 3D semiconductor devices as illustrated in the embodiments above, all of the cells can be read at the same time. Additionally, the bandwidth of the 3D semiconductor device can be enlarged (increased), the power consumption can be reduced, and the disturbance between adjacent cells during reading can also be reduced.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A three-dimensional (3D) semiconductor device, comprising:

a plurality of [memory] *gate* layers vertically stacked on a substrate and parallel to each other;

a plurality of selection lines disposed on the [memory] *gate* layers and parallel to each other;

a plurality of bit lines disposed on the selection lines, and the bit lines arranged in parallel to each other and in perpendicular to the selection lines;

a plurality of strings formed vertically to the [memory] *gate* layers and the selection lines, and the strings electrically connected to the corresponding selection lines;

a plurality of cells respectively defined by the strings, the selection lines and the bit lines correspondingly, and the cells arranged in a plurality of rows and columns, wherein the bit lines are parallel to a column direction while the selection lines are parallel to a row direction; *and*

*a plurality of string contacts formed vertically to the gate layers and the selection lines, and each of the string contacts disposed correspondingly at each of the string of the cells, wherein the string contacts are electrically connected to the corresponding selection lines and the corresponding bit lines;* wherein the adjacent cells in the same column are electrically connected to the different bit lines*; and*

*wherein positions of the string contacts are correspondingly shifted away from centers of the string of the cells*.

2. The device according to claim 1, wherein at least two bit lines are disposed correspondingly to the cells arranged in the same column.

3. The device according to claim 1, wherein four bit lines are disposed correspondingly to the cells arranged in the same column.

4. The device according to claim 1, wherein the cells of at least two adjacent rows are electrically connected to one of the selection lines.

5. The device according to claim 1, wherein the cells of four adjacent rows are electrically connected to one of the selection lines.

[6. The device according to claim 1, further comprising:

a plurality of string contacts formed vertically to the memory layers and the selection lines, and each of the string contacts disposed correspondingly at each of the strings of the cells, wherein the string contacts are electrically connected to the corresponding selection lines and the corresponding bit lines.]

[7. The device according to claim 6, wherein positions of the string contacts are correspondingly shifted away from centers of the strings of the cells.]

8. The device according to claim [6] *1*, wherein the adjacent string contacts of the cells arranged in the same row are misaligned.

9. The device according to claim [6] *1*, wherein for the string contacts of the cells arranged in the same row, every other string contact is aligned to form a straight line along the row direction.

10. The device according to claim 9, wherein the string contacts of the cells arranged in the same row are aligned at a first straight line and a second straight line along a row direction, and the first straight line is positioned correspondingly to an upper portion of the strings while the second straight line is positioned correspondingly to a lower portion of the strings.

11. The device according to claim 9, wherein the string contacts of each row are electrically connected to one of the selection lines.

12. The device according to claim 9, wherein the string contacts of every four rows are electrically connected to one of the selection lines.

13. The device according to claim [6] *1*, wherein two of the adjacent string contacts of the cells arranged in the same column are misaligned.

14. The device according to claim [6] *1*, wherein for the string contacts of the cells arranged in the same column, at least every other string contact is aligned to form a straight line along the column direction.

15. The device according to claim [6] *1*, wherein for the string contacts of the cells arranged in the same column, every other [three] string [contacts are] *contact is* aligned to form a straight line along the column direction, and the string contacts of every four rows are electrically connected to one of the selection lines, and each of the bit lines on the cells is positioned correspondingly along each of the straight lines.

16. The device according to claim [6] *1*, wherein the string contacts [are directly connected to the corresponding bit lines when] *of* the cells are arranged in a honeycomb array[, and each of the string contacts is positioned corresponding to a center of each of the cells when the cells are arranged in the honeycomb array, and each of the selection lines corresponds to the cells in two adjacent rows].

17. The device according to claim [6] *1*, wherein for the string contacts of the cells in the same column, the string contacts of the cells in every other rows are respectively shifted to a left position and a right position, and the adjacent two bit lines are respectively disposed along the left position and a right position of the cells in the same column, wherein the string contacts are oval or rectangular in shape, and each has a size of X in width parallel to the row direction and Y in length parallel to the column direction, and Y>X, or Y>2X.

18. The device according to claim [6] *1*, wherein the string contacts are electrically connected to the corresponding bit lines through a patterned metal layer and a plurality of conductive vias when the cells are arranged in a matrix array.

19. The device according to claim 18, wherein the patterned metal layer comprises a plurality of metal portions respectively formed on the corresponding string contacts of the cells, and each of the conductive vias formed on each of the metal portions is electrically connected to the corresponding bit line, the metal portions partially or fully cover the corresponding string contacts, and the adjacent metal portions of the cells in the same row are misaligned, wherein a distance between the two adjacent cells along the row direction is defined as a cell pitch $P_X$ while another distance between the two adjacent cells along the column direction is defined as a cell pitch $P_y$, when one of the metal portions at least partially covers the corresponding string contact of the cell, and said metal portion at least comprises a first part having a rectangular shape and a size of X in width parallel to the row direction and Y1 in length parallel to the column direction, wherein $2P_X>X>P_X$ and $Y1<1/2P_y$; when one of the metal portions fully covers the corresponding string contact, said metal portion comprises the first part and a second part connected to the first part, and the first and second parts in sum has an overall length Y2 parallel to the column direction, wherein $Y2>1/2P_y$.

20. The device according to claim 1, wherein each of the strings comprises a channel layer surrounding a conductive layer, and the conductive layers of the cells in the adjacent rows partially overlap when the cells are arranged in a honeycomb array.

*21. The device according to claim 1, wherein for the string contacts of the cells in the same column, the string contacts of the cells in every other row are respectively shifted to a left position and a right position, and the adjacent two bit lines are respectively disposed along the left position and a right position of the cells in the same column, wherein each of the string contacts has a size of X in width parallel to the row direction and Y in length parallel to the column direction, and Y>X.*

*22. The device according to claim 1, wherein for the string contacts of the cells in the same column, the string contacts of the cells in every other row are respectively shifted to a left position and a right position, and the adjacent two bit lines are respectively disposed along the left position and a right position of the cells in the same column, wherein each of the string contacts has a size of X in width parallel to the row direction and Y in length parallel to the column direction, and Y>2X.*

*23. A three-dimensional (3D) semiconductor device, comprising:*

*a plurality of gate layers vertically stacked on a substrate and parallel to each other to form a memory stack extending along a first direction, the memory stack having a first width across the first direction;*

*a plurality of selection lines disposed over the memory stack and parallel to each other, the plurality of selection lines including a first selection line above the memory stack and within the first width of the memory stack, and a second selection line above the memory stack and within the first width of the memory stack, the first and second selection lines are disposed laterally apart from each other and located at same horizontal level;*

*a plurality of bit lines disposed over the first and second selection lines, arranged in parallel to each other and perpendicular to the first and second selection lines;*

*a plurality of strings formed vertically to the gate layers and the first and second selection lines, and the strings electrically connected to the corresponding first and second selection lines and electrically connected to the gate layers;*

*a plurality of cells respectively defined by the strings, the first and second selection lines and the bit lines correspondingly, and the cells arranged in a plurality of rows and columns according to the first direction and a second direction, wherein the bit lines are parallel to the second direction while the selection lines are parallel to the first direction; and*

*a plurality of string contacts formed vertically to the gate layers and the selection lines, and each of the string contacts disposed correspondingly at each of the strings of the cells, wherein the string contacts are electrically connected to the corresponding first selection line, second selection line, and the corresponding bit lines;*

*wherein adjacent cells in the same column within the first selection line are electrically connected to different bit lines, and adjacent cells in the same column within the second selection line are electrically connected to different bit lines; and*

*wherein positions of the string contacts are correspondingly shifted away from centers of the strings of the cells.*

*24. The device according to claim 23, wherein there are at least two rows of cells within the first selection line, and at least two rows of cells within the second selection line.*

*25. The device according to claim 24, wherein there are at least two bit lines in the plurality of bit lines overlying each column of cells in the plurality of rows and columns.*

*26. The device according to claim 23, wherein there are four rows of cells within the first selection line.*

*27. The device according to claim 23, wherein at least two bit lines are disposed correspondingly to the cells arranged in the same column.*

*28. The device according to claim 23, wherein the cells of at least two adjacent rows are electrically connected to one of the selection lines.*

*29. The device according to claim 23, wherein for the string contacts of the cells arranged in the same row, every other string contact is aligned to form a straight line along the first direction.*

*30. The device according to claim 29, wherein the string contacts of every four rows are electrically connected to one of the first selection line or the second selection line.*

*31. The device according to claim 23, wherein two of the adjacent string contacts of the cells arranged in the same column are misaligned.*

*32. The device according to claim 23, wherein for the string contacts of the cells in the same column, the string contacts of the cells in every other rows are respectively shifted to a left position and a right position, and the adjacent two bit lines are respectively disposed along the left position and a right position of the cells in the same column, wherein the string contacts are oval or rectangular in shape, and each has a size of X in width parallel to the first direction and Y in length parallel to the second direction, and Y>2X.*

*33. The device according to claim 23, wherein for the string contacts of the cells in the same column, the string contacts of the cells in every other rows are respectively shifted to a left position and a right position, and the adjacent two bit lines are respectively disposed along the left position and a right position of the cells in the same column, and each string contact has a size of X in width parallel to the first direction and Y in length parallel to the second direction, and Y>2X.*

*34. The device according to claim 23, wherein each of the strings comprises a storage layer surrounding a conductive layer, and the conductive layers of the cells in the adjacent rows partially overlap when the cells are arranged in a honeycomb array.*

*35. The device according to claim 23, wherein the cells in the adjacent rows partially overlap when the cells are arranged in a honeycomb array.*

* * * * *